United States Patent
Tang et al.

(10) Patent No.: US 12,068,322 B2
(45) Date of Patent: Aug. 20, 2024

(54) METHOD OF FORMING A MULTI-LAYER EPITAXIAL SOURCE/DRAIN REGION HAVING VARYING CONCENTRATIONS OF BORON AND GERMANIUM THEREIN

(71) Applicant: Taiwan Semiconductor Manufacturing Co., Ltd., Hsinchu (TW)

(72) Inventors: Han-Yu Tang, Hsinchu (TW); Hung-Tai Chang, Hsinchu (TW); Ming-Hua Yu, Hsinchu (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 344 days.

(21) Appl. No.: 17/161,978

(22) Filed: Jan. 29, 2021

(65) Prior Publication Data
US 2022/0246611 A1 Aug. 4, 2022

(51) Int. Cl.
*H01L 29/66* (2006.01)
*H01L 21/8234* (2006.01)
*H01L 21/8238* (2006.01)
*H01L 27/092* (2006.01)
*H01L 29/04* (2006.01)
(Continued)

(52) U.S. Cl.
CPC .. *H01L 27/0924* (2013.01); *H01L 21/823418* (2013.01); *H01L 21/823431* (2013.01); *H01L 21/823468* (2013.01); *H01L 29/045* (2013.01); *H01L 29/0847* (2013.01); *H01L 29/41791* (2013.01); *H01L 29/66545* (2013.01); *H01L 29/6656* (2013.01); *H01L 29/66575* (2013.01); *H01L 29/66636* (2013.01); *H01L 29/66795* (2013.01); *H01L 29/7851* (2013.01); *H01L 21/823814* (2013.01); *H01L 29/7848* (2013.01)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 21/823418; H01L 21/823814; H01L 21/823425; H01L 29/0847; H01L 29/7848; H01L 29/66636; H01L 29/66575; H01L 29/41775; H01L 29/41783; H01L 21/02609; H01L 29/045
See application file for complete search history.

(56) References Cited

U.S. PATENT DOCUMENTS 9,105,490 B2  8/2015  Wang et al.
9,236,267 B2  1/2016  De et al.
(Continued)

*Primary Examiner* — Younes Boulghassoul
(74) *Attorney, Agent, or Firm* — Slater Matsil, LLP

(57) ABSTRACT

An embodiment includes a first fin extending from a substrate. The device also includes a first gate stack over and along sidewalls of the first fin. The device also includes a first gate spacer disposed along a sidewall of the first gate stack. The device also includes a first epitaxial source/drain region in the first fin and adjacent the first gate spacer, an outer surface of the epitaxial first source/drain region having more than eight facets in a first plane, the first plane being orthogonal to a top surface of the substrate.

20 Claims, 21 Drawing Sheets

(51) Int. Cl.
    *H01L 29/08*     (2006.01)
    *H01L 29/417*     (2006.01)
    *H01L 29/78*     (2006.01)

(56) References Cited

U.S. PATENT DOCUMENTS

| | | | |
|---|---|---|---|
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 10,269,648 | B1 * | 4/2019 | Li .................... H01L 29/66795 |
| 2016/0293701 | A1 * | 10/2016 | Liao .................... H01L 29/7848 |
| 2017/0077244 | A1 * | 3/2017 | Chang ................ H01L 29/0657 |
| 2018/0151378 | A1 * | 5/2018 | Huang .............. H01L 21/76805 |
| 2018/0175172 | A1 * | 6/2018 | Chang .................. H01L 29/045 |
| 2020/0075423 | A1 * | 3/2020 | Kwok ............. H01L 21/823481 |
| 2020/0105621 | A1 * | 4/2020 | Lin .................... H01L 29/1054 |
| 2020/0105876 | A1 * | 4/2020 | Ting .................... H01L 29/7848 |
| 2020/0105932 | A1 * | 4/2020 | Li ....................... H01L 29/6681 |
| 2020/0135914 | A1 * | 4/2020 | Lin .......................... G01N 1/14 |
| 2020/0168723 | A1 * | 5/2020 | Hsu ....................... H01L 29/165 |

* cited by examiner

METHOD OF FORMING A MULTI-LAYER EPITAXIAL SOURCE/DRAIN REGION HAVING VARYING CONCENTRATIONS OF BORON AND GERMANIUM THEREIN

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
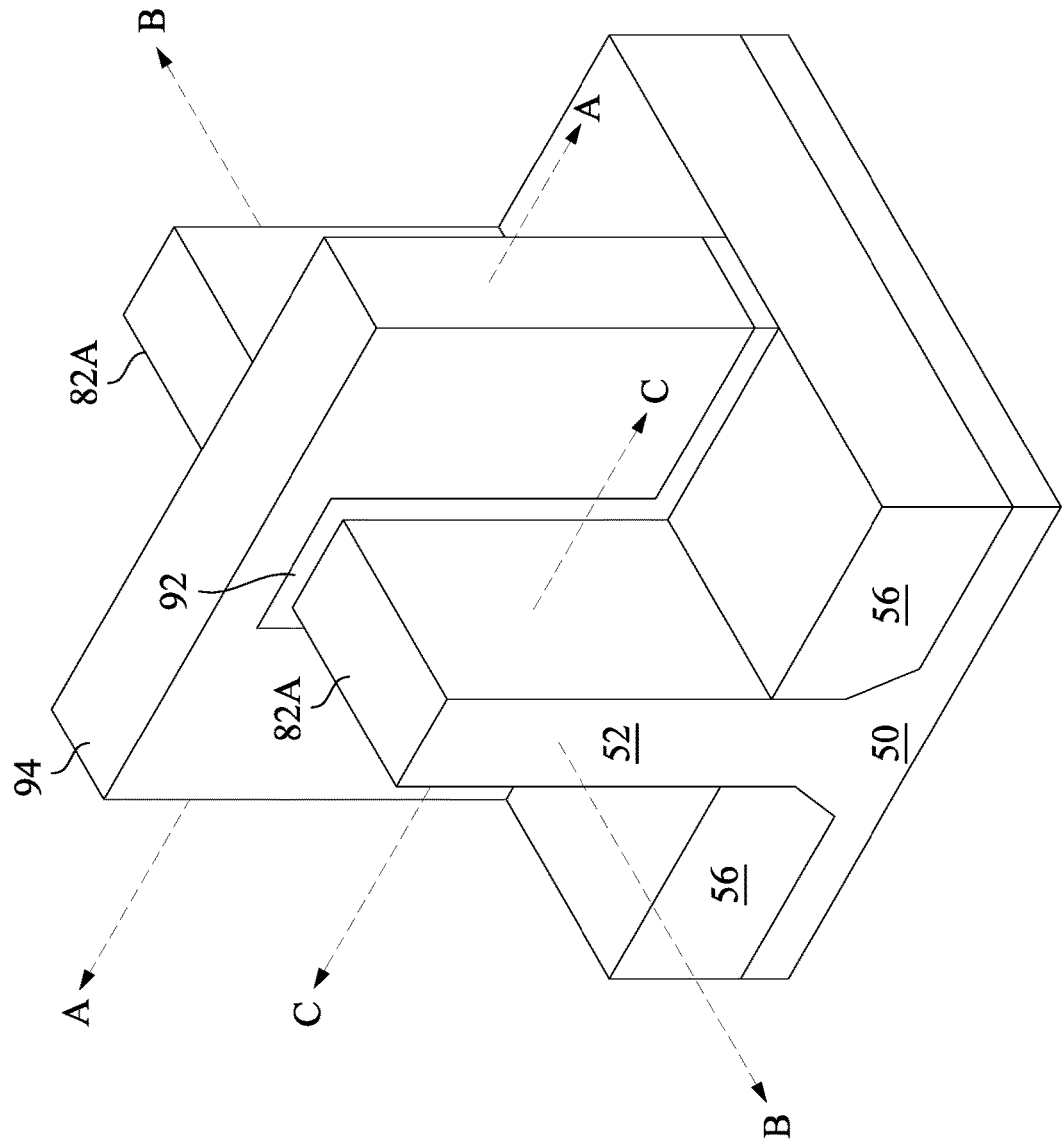
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-last (sometimes referred to as replacement gate process) process. In other embodiments, a gate-first process may be used. Some variations of the embodiments are discussed. Also, some embodiments contemplate aspects used in planar devices, such as planar FETs. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Before addressing the illustrated embodiments specifically, certain advantageous features and aspects of the present disclosed embodiments will be addressed generally. In general terms, the present disclosure is a semiconductor device and method of forming the same to improve the performance of FinFET devices by reducing the source/drain contact resistance of the semiconductor device. In the disclosed embodiments, the source/drain regions include a multi-faceted epitaxial source/drain region with an enlarged contact landing area to reduce the resistance between the contact and the source/drain region. In some embodiments, the epitaxial source/drain region for a single fin includes eight or more facet planes. By having more facet planes for the epitaxial source/drain region, the top surface of the epitaxial source/drain region—where the contact landing area is located—is flatter and thus allows for a larger contact landing area. The more facet planes in the epitaxial source/drain region may be formed by configuring the ratio of flow rates of etchant precursors to deposition precursors during the epitaxial growth process of the source/drain region. For example, by having an ultra-low ratio of flow rates of etchant precursors to deposition precursors, the number of facets can increase. The disclosed processes and structures can improve the performance and reliability of the FinFET device.

Some embodiments contemplate both n-type devices, such as n-type FinFETs, and p-type devices, such as p-type FinFETs, being manufactured during a manufacturing process. Hence, some embodiments contemplate the formation of complementary devices. Figures below may illustrate one device, but one of ordinary skill in the art will readily understand that multiple devices, some with a different device type, can be formed during processing. Some aspects of the formation of complementary devices are discussed below, although such aspects may not necessarily be illustrated in the figures.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 17B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 12A, 13A, 14A, 15A, 16A, and 17A are illustrated along reference cross-section A-A illustrated in FIG. 1, and FIGS. 8B, 9B, 10B, 11B, 12B, 13B, 14B, 15B, 15C, 16B, and 17B are illustrated along a similar cross-section B-B illustrated in FIG. 1, except for multiple fins/FinFETs. FIGS. 10C, 10D, 11A, 11B, 11C, and 17C are illustrated along reference cross-section C-C illustrated in FIG. 1, except FIGS. 10C-10D illustrate multiple fins/FinFETs.

Figure 2:
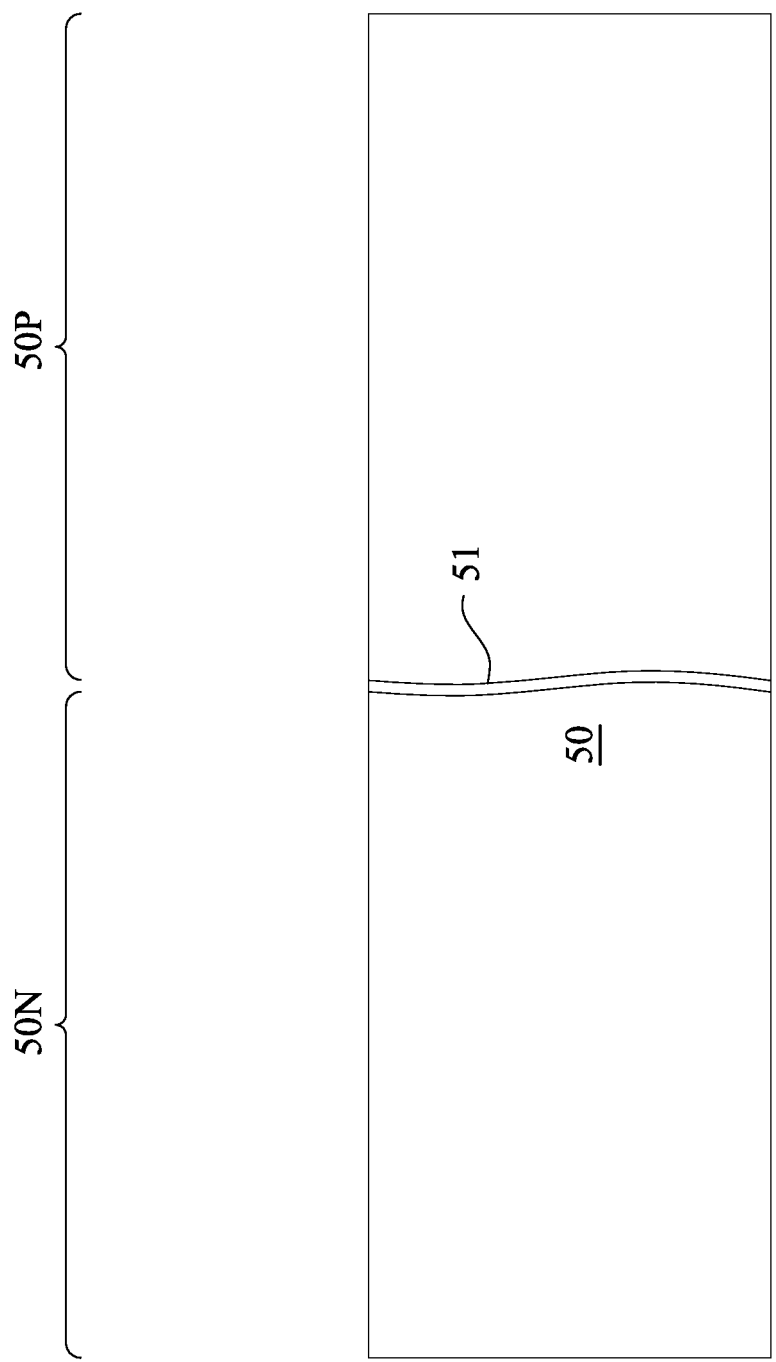
FIGS. 2, 3, 4, 5, 6, 7, 8A, 8B, 9A, 9B, 10A, 10B, 10C, 10D, 11A, 11B, 11C 12A, 12B, 13A, 13B, 14A, 14B, 15A, 15B, 15C, 16A, 16B, 17A, 17B, and 17C are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
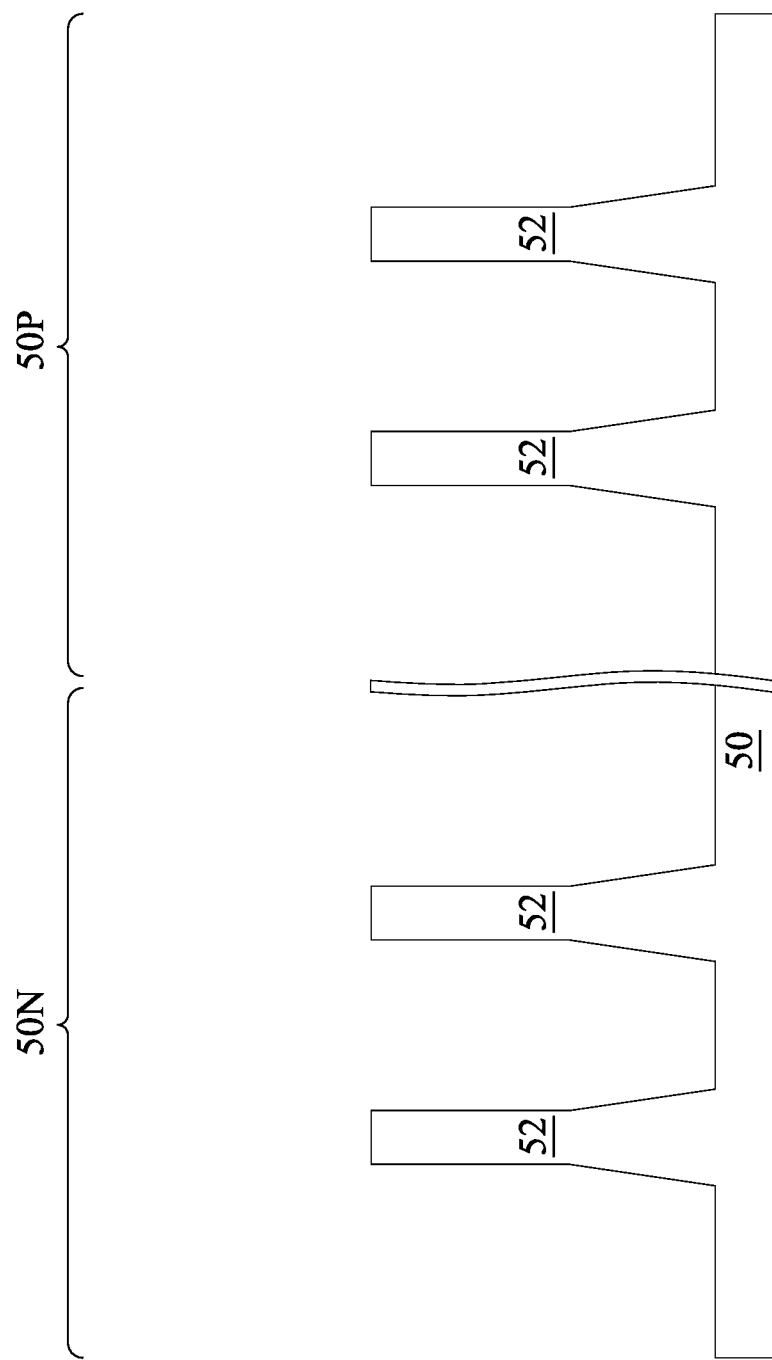

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
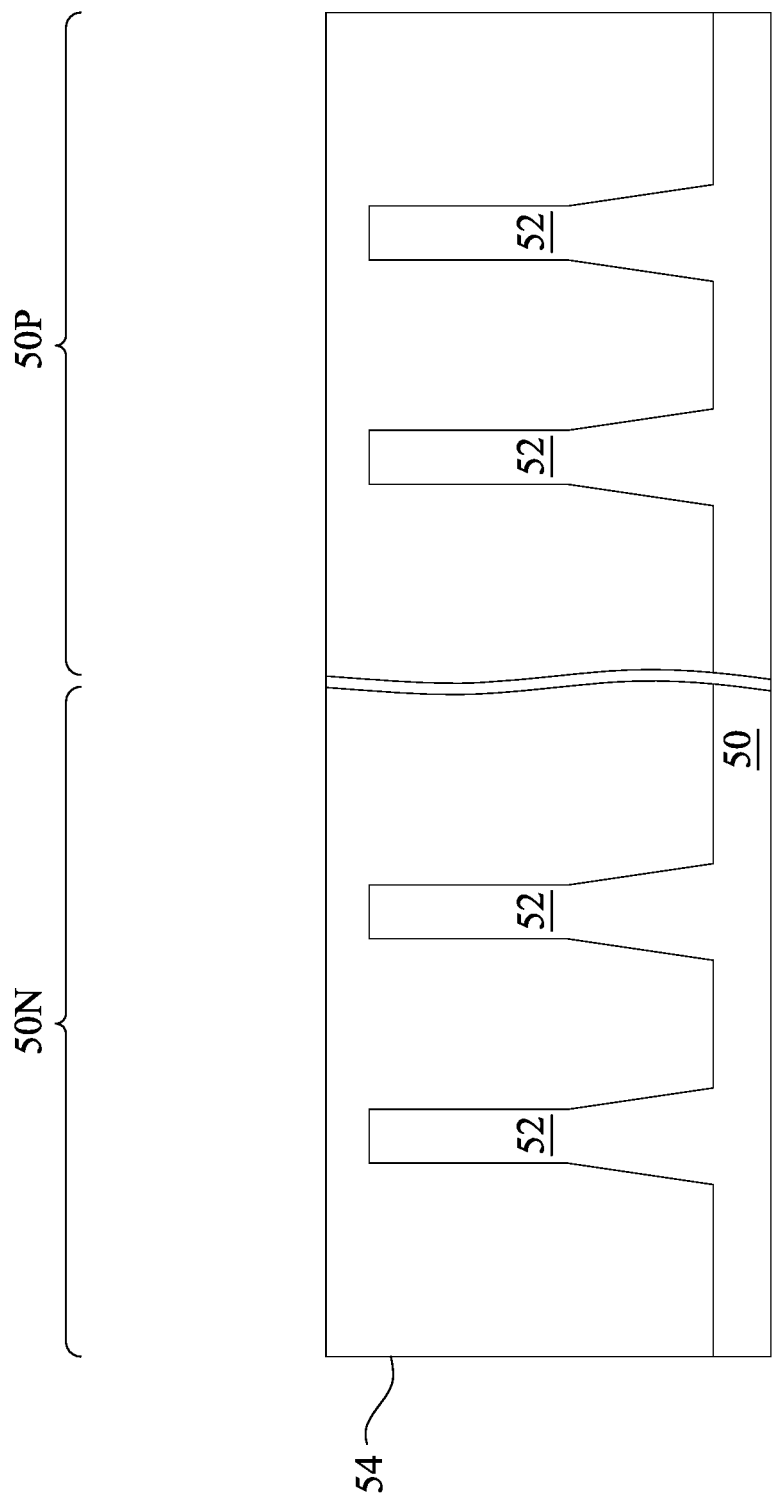

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
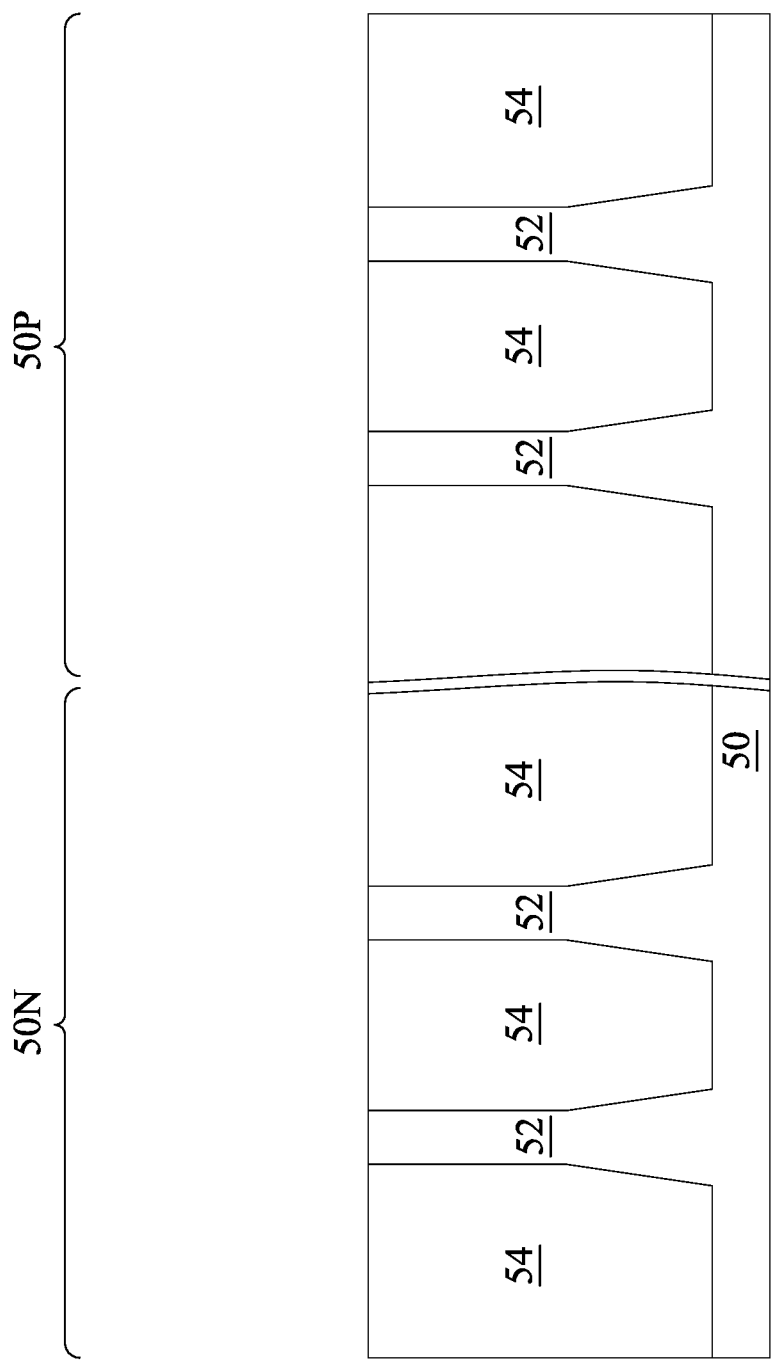

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
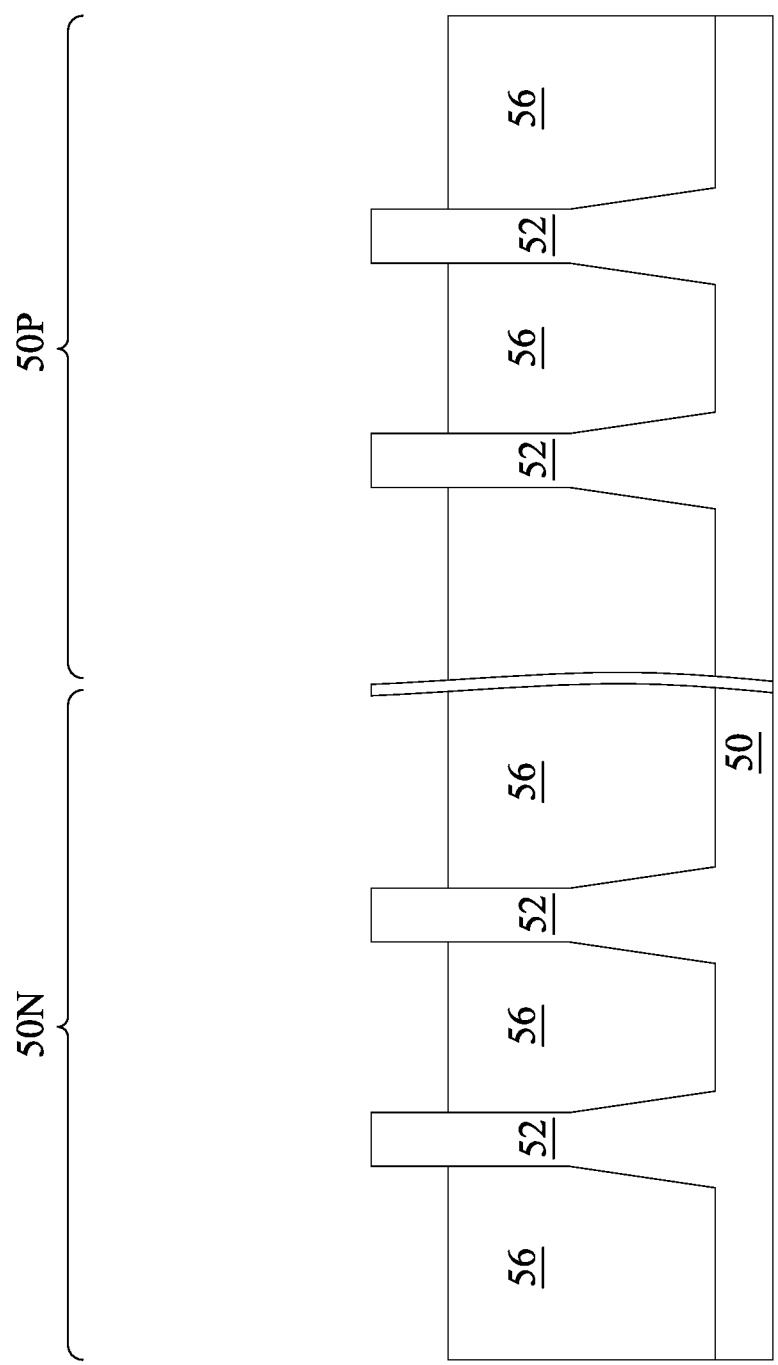

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
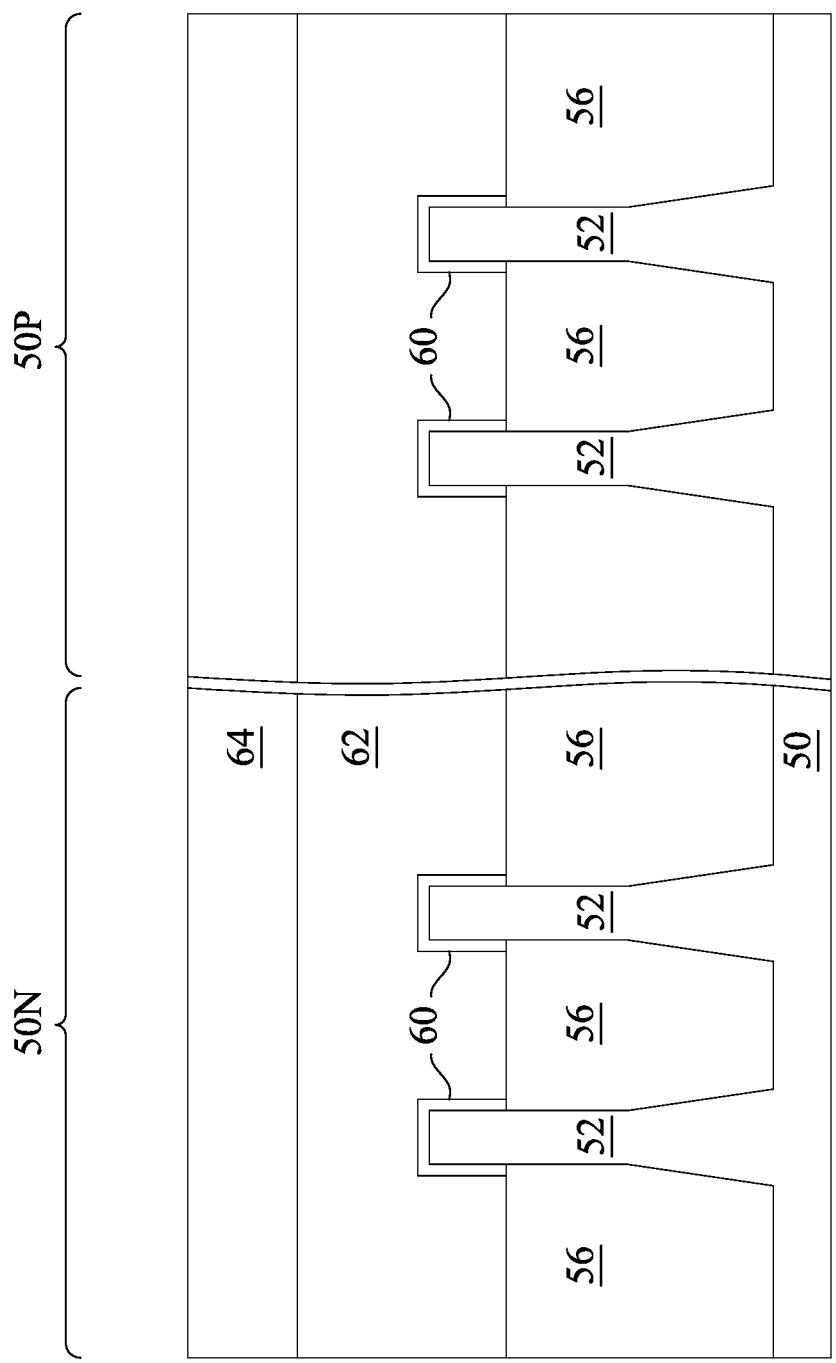

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 17B illustrate various additional steps in the manufacturing of embodiment devices. FIGS. 8A through 17B illustrate features in either of the n-type region 50N and the p-type region 50P. For example, the structures illustrated in FIGS. 8A through 17B may be applicable to both the n-type region 50N and the p-type region 50P. Differences (if any) in the structures of the n-type region 50N and the p-type region 50P are described in the text accompanying each figure.

Figure 8B:
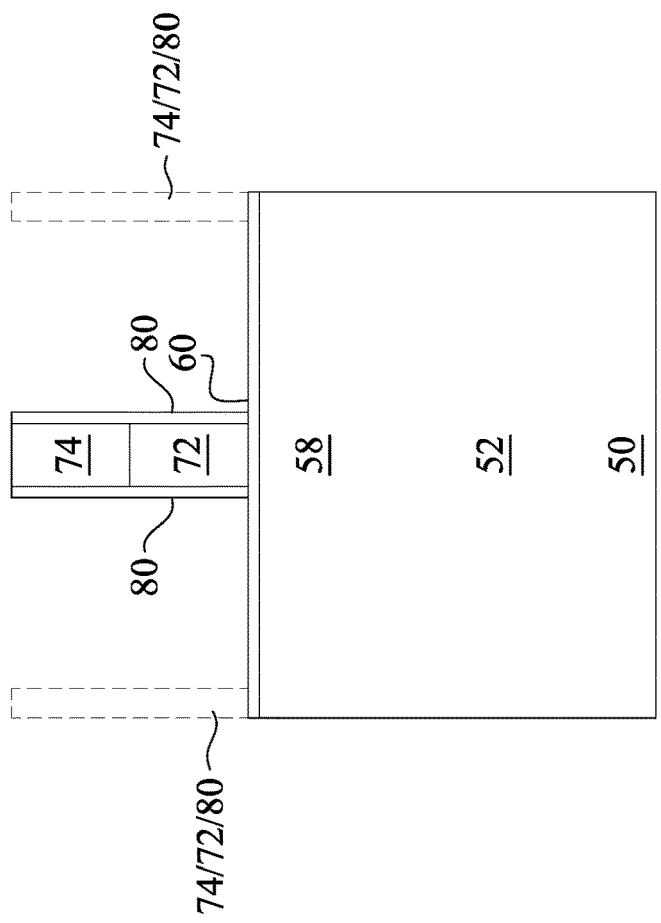
Figure 8A:
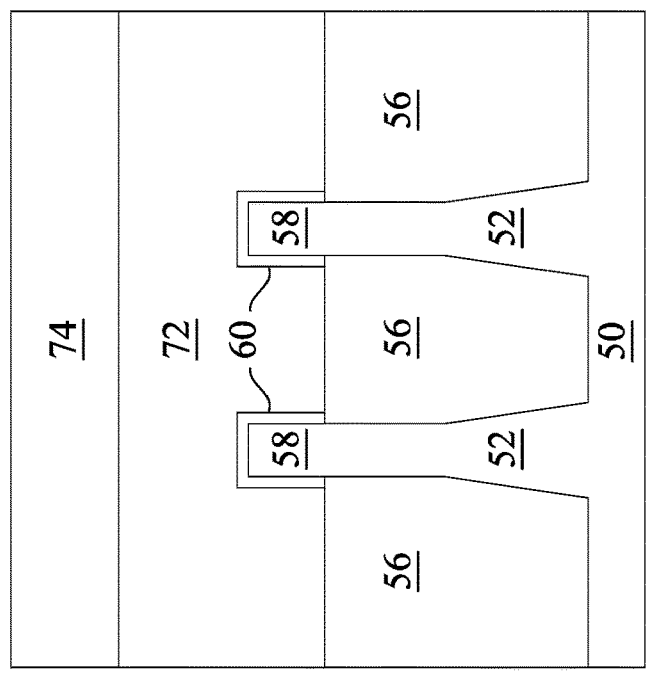

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
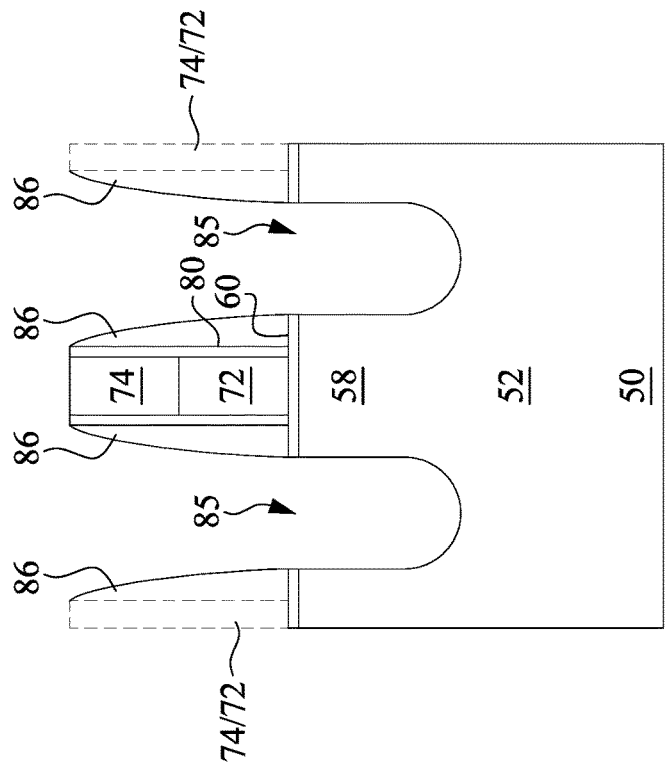
Figure 9A:
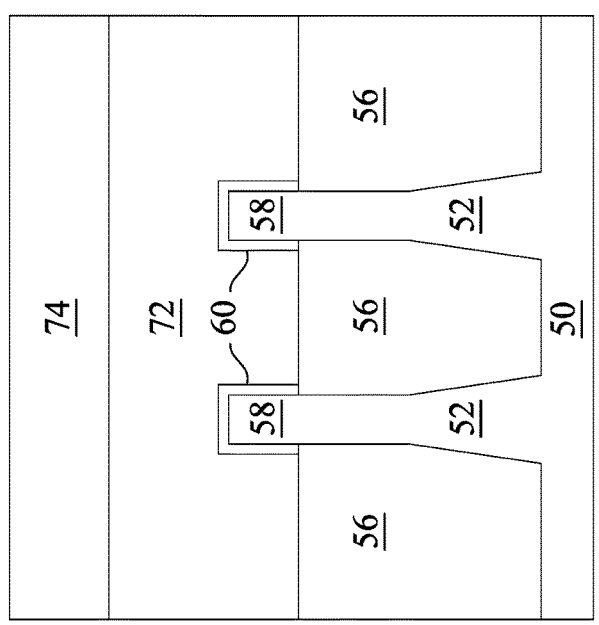

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

In FIGS. 9A, 9B, 10A, 10B, 10C, 10D, 11A, 11B, and 11C source/drain regions 82 are formed in the fins 52 to exert stress in the respective channel regions 58, thereby improving performance. The source/drain regions 82 are formed in the fins 52 such that each dummy gate 72 is disposed between respective neighboring pairs of the source/drain regions 82. In some embodiments the source/drain regions 82 may extend into, and may also penetrate through, the fins 52. In some embodiments, the gate spacers 86 are used to separate the source/drain regions 82 from the dummy gates 72 by an appropriate lateral distance so that the source/drain regions 82 do not short out subsequently formed gates of the resulting FinFETs.

The formation of the source/drain regions 82 may be formed by distinct processes, such that the source/drain regions 82 may be different materials in each region and may be formed by distinct processes. Various masking steps may be used to mask and expose appropriate regions when using distinct processes.

Referring first to FIGS. 9A and 9B, a patterning process is performed on the fins 52 to form recesses 85 in source/drain regions of the fins 52. The patterning process may be performed in a manner that the recesses 85 are formed between neighboring dummy gate stacks 72/74 (in interior regions of the fins 52), or between an isolation region 56 and adjacent dummy gate stacks 72/74 (in end regions of the fins 52). In some embodiments, the patterning process may include a suitable anisotropic dry etching process, while using the dummy gate stacks 72/74, the gate spacers 86, and/or isolation regions 56 as a combined mask. The suitable anisotropic dry etching process may include a reactive ion etch (RIE), neutral beam etch (NBE), the like, or a combination thereof. In some embodiments where the RIE is used in the first patterning process, process parameters such as, for example, a process gas mixture, a voltage bias, and an RF power may be chosen such that etching is predominantly performed using physical etching, such as ion bombardment, rather than chemical etching, such as radical etching through chemical reactions. In some embodiments, a voltage bias may be increased to increase energy of ions used in the ion bombardment process and, thus, increase a rate of physical etching. Since, the physical etching in anisotropic in nature and the chemical etching is isotropic in nature, such an etching process has an etch rate in the vertical direction that is greater than an etch rate in the lateral direction. In some embodiments, the anisotropic etching process may be performed using a process gas mixture including fluoromethane, methane, hydrogen bromide, oxygen, argon, a combination thereof, or the like. In some embodiments, the patterning process forms recesses 85 having U-shaped bottom surfaces. The recesses 85 may also be referred to as U-shaped recesses 85, an example recess 85 of which is shown in FIG. 9B. In some embodiments, the depth of the recesses 85 is in a range from about 35 nm to about 60 nm as measure from a top surface of the fin 52.

In FIGS. 10A through 10D, the source/drain regions 82 are formed in the recesses 85. In some embodiments, the source/drain regions include more facets than typical source/drain regions (see, e.g., FIG. 11A). The more facet planes in the epitaxial source/drain regions 82 may be formed by configuring the ratio of flow rates of etchant precursors to deposition precursors during the epitaxial growth process of the source/drain regions 82. For example, by having an ultra-low ratio of flow rates of etchant precursors to deposition precursors, the number of facets can increase.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain 82 may include any acceptable material, such as appropriate for n-type FinFETs. For example, if the fin 52 is silicon, the epitaxial source/drain 82 in the n-type region 50N may include materials exerting a tensile strain in the channel region 58, such as silicon, silicon carbide, phosphorous doped silicon carbide, silicon phosphide, or the like. The epitaxial source/drain 82 in the n-type region 50N may have surfaces raised from respective surfaces of the fins 52 and may have facets.

In the embodiments of the source/drain 82 in the n-type region 50N, the source/drain region 82 can be epitaxially grown with a ratio of flow rates of etchant precursors to deposition precursors in a range from 0.05/1 to 0.25/1. If the ratio of flow rates of etchant precursors to deposition precursors was less than 0.05/1, the epitaxial process would lose selectivity such that the epitaxial process would grow in undesired locations. If the ratio of flow rates of etchant precursors to deposition precursors was greater than 0.25/1, the number facets would be less than eight and the contact landing area of the source/drain region would be reduced. In some embodiments, the source/drain regions 82 in the n-type region 50N are grown in an environment at a temperature in a range from 500° ° C. to 700° C. If the temperature during the epitaxial process is lower than 500° C., the faceting of the source/drain regions 82 in the n-type region 50N would be reduced. In some embodiments, the etchant precursors include HCl, $Cl_2$, the like, or a combination thereof. In some embodiments, the deposition precursors include silane, dichlorosilane (DCS), $PH_3$, the like, or a combination thereof.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain 82 may include any acceptable material, such as appropriate for p-type FinFETs. For example, if the fin 52 is silicon, the epitaxial source/drain 82 in the p-type region 50P may comprise materials exerting a compressive strain in the channel region 58, such as silicon-germanium, boron doped silicon-germanium, germanium, germanium tin, or the like. The epitaxial source/drain 82 in the p-type region 50P may have surfaces raised from respective surfaces of the fins 52 and may have facets.

In the embodiments of the source/drain 82 in the p-type region 50P, the source/drain region 82 can be epitaxially grown with a ratio of flow rates of etchant precursors to deposition precursors in a range from 0.05/1 to 0.025/1. If the ratio of flow rates of etchant precursors to deposition precursors was less than 0.05/1, the epitaxial process would lose selectivity such that the epitaxial process would grow in undesired locations. If the ratio of flow rates of etchant precursors to deposition precursors was greater than 0.25/1, the number facets would be less than eight and the contact landing area of the source/drain region would be reduced. In some embodiments, the source/drain regions 82 in the p-type region 50P are grown in an environment at a temperature in a range from 500° C. to 700° C. If the temperature during the epitaxial process is lower than 500° C., the faceting of the source/drain regions 82 in the p-type region 50P would be reduced. In some embodiments, the etchant precursors include hydrogen chloride (HCl), $Cl_2$, other chlorine-containing etchants, the like, or a combination thereof. In some embodiments, the deposition precursors include silane, dichlorosilane (DCS), $GeH_4$, $B_2H_6$, the like, or a combination thereof.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C-D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
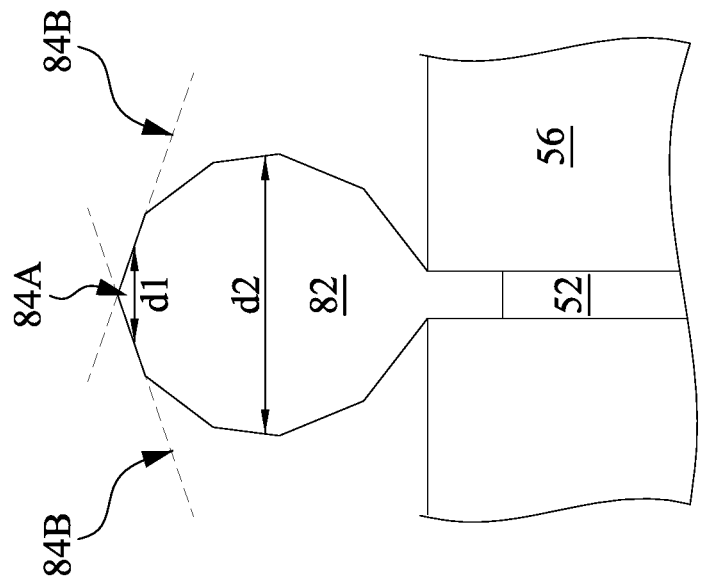
Figure 11A:
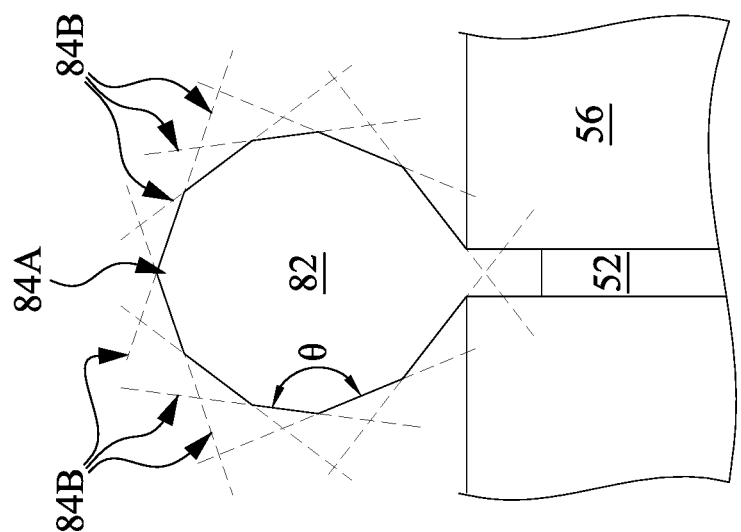
Figure 11C:
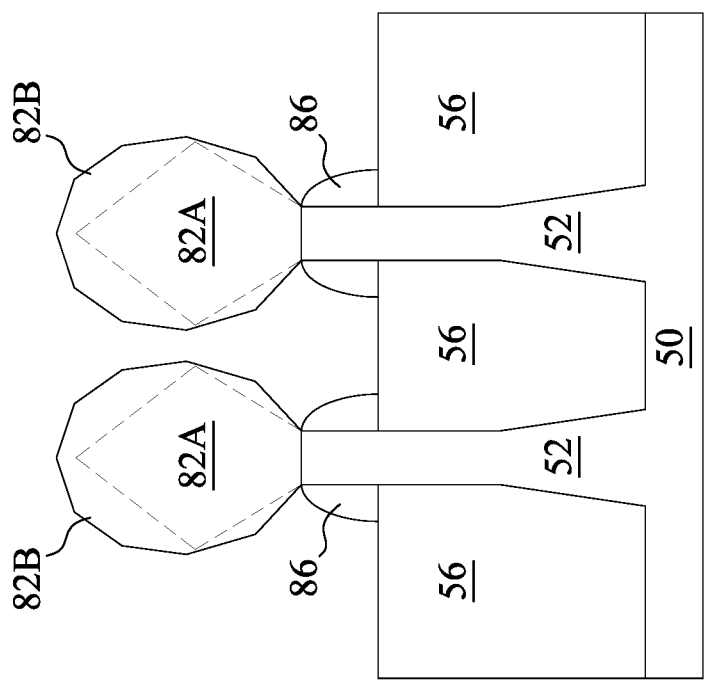

FIGS. 11A, 11B, and 11C are detailed views of a single source/drain region 82. In FIG. 11A, the facet planes 84 of the source/drain region 82 is illustrated. Specifically, facet plane 84A is at a top of the source/drain region and, in some embodiments, is along a (100) plane. The facet planes 84B are the other facet planes around the source/drain region 82 in the cross-sectional view and the facet planes 84B include facets along (11X) planes, such as (111), (113), and (119) planes. In some embodiments, each source/drain region 82 may have more than eight facets in the cross-sectional view. In some embodiments, each source/drain region 82 may have from eight facets to twelve facets in the cross-sectional view.

Adjacent facet planes 84B intersect to form angles between the adjacent facet planes 84B. The facet planes 84B that intersect at the widest portion of the source/drain region 82 in the cross-sectional view of FIG. 11A form an angle Θ. In some embodiments, the angle Θ is greater than 140°. In some embodiments, the angle Θ is in a range from 140° to 180°.

The ultra-low ratio flow rate ratio of etchant to deposition precursors may cause the source/drain regions 82 to have more than eight facets in the cross-sectional views illustrated in FIGS. 11A, 11B, and 11C. By having more facet planes 84 for the epitaxial source/drain region 82, the top surface of the epitaxial source/drain region 82—where the contact landing area is located—is flatter and thus allows for a larger contact landing area. In FIG. 11B, a distance D1 on a top surface of the epitaxial source/drain region 82 is defined by the distance between outer edges of the two top facet planes 84B that are on opposite sides of the top facet plane 84A. In FIG. 11B, a distance D2 is defined as the maximum width of the source/drain region 82 in the cross-sectional view of FIG. 11B. In some embodiments, the distance D1 is up to 70% of the distance D2. In some embodiments, the distance D1 is in a range from 30% to 70% of the distance D2.

In some embodiments, each of the source/drain regions 82 includes multiple layers 82A and 82B as illustrated in FIG. 11C. In FIG. 11C, an inner layer 82A is formed in the recess 85 of the fin 52 and an outer layer 82B is formed over the first layer 82A. In some embodiments, the inner layer 82A has four facets on the (111) planes and the outer layer 82B has more than eight facets on the (11X) planes as described above.

In some embodiments, the outer source/drain epitaxial layer 82B has a different material composition than the inner layer 82A. In some embodiments, the inner source/drain epitaxial layer 82A has a higher germanium concentration than the outer source/drain epitaxial layer 82B and a lower boron concentration than the outer source/drain epitaxial layer 82B. In some embodiments, the inner source/drain epitaxial layer 82A has a germanium concentration in a range from 40% to 80% and has a boron concentration in a range from $3E20$ cm$^{-3}$ to $5E20$ cm$^{-3}$. In some embodiments, the outer source/drain epitaxial layer 82B has a germanium concentration in a range from 20% to 60% and has a boron concentration in a range from $6E20$ cm$^{-3}$ to $1E21$ cm$^{-3}$. In some embodiments, the source/drain region layers 82A and 82B may be in situ doped during growth. In some embodiments, the source/drain region layers 82A and 82B may be doped by an implant process. In both in situ doping and implant doping, the process may be followed by an anneal process.

Figure 10B:
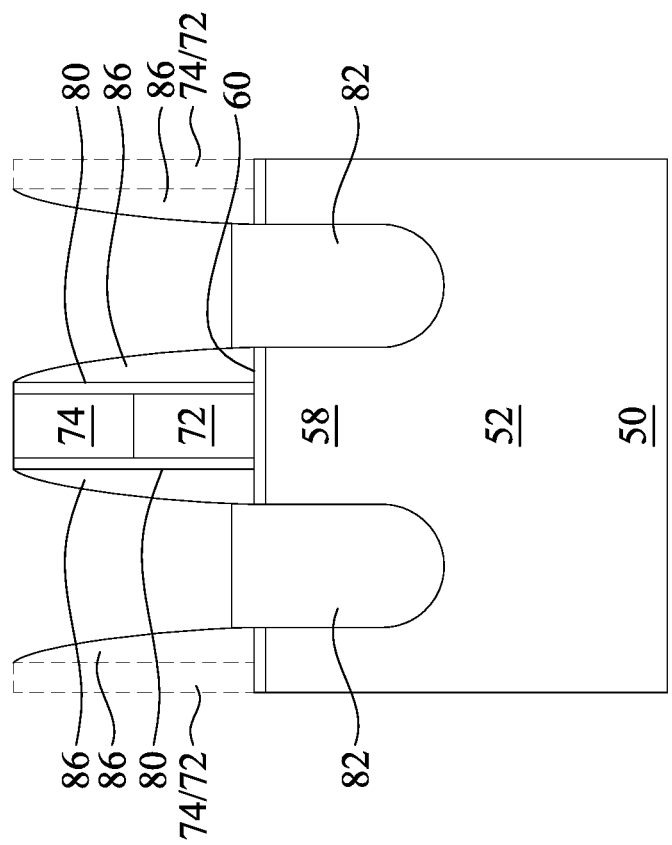

In some embodiments, once the outer layer 82B is grown, the interface between the inner layer 82A and the outer layer 82B is not distinguishable. As illustrated in FIG. 10B the source/drain region 82 physically contacts the gate spacers 86. In some embodiments, the source/drain region 82 does not physically contact the gate spacer 86.

In some embodiments, the source/drain regions 82 in the p-type regions 50P include both the layers 82A and 82B while the source/drain regions 82 in the n-type regions do not include multiple layers. In some embodiments, both of the regions 50P and 50N include the same number of layers in the source/drain regions 82.

The above-described method of forming the source/drain regions 82 can improve the performance of FinFET devices by reducing the source/drain contact resistance of the semiconductor device. In the disclosed embodiments, the source/drain regions 82 include a multi-faceted epitaxial source/drain region 82 with an enlarged contact landing area to reduce the resistance between the subsequently formed contact and the source/drain region 82. In some embodiments, the epitaxial source/drain region 82 for a single fin includes eight or more facet planes 84. By having more facet planes 84 for the epitaxial source/drain region 82, the top surface of the epitaxial source/drain region—where the contact landing area is located—is flatter and thus allows for a larger contact landing area. The more facet planes 84 in the epitaxial source/drain region can be formed by configuring the ratio of flow rates of etchant precursors to deposition precursors during the epitaxial growth process of the source/drain region 82. For example, by having an ultra-low ratio of flow rates of etchant precursors to deposition precursors, the number of facet planes 84 can be increased.

Figure 10A:
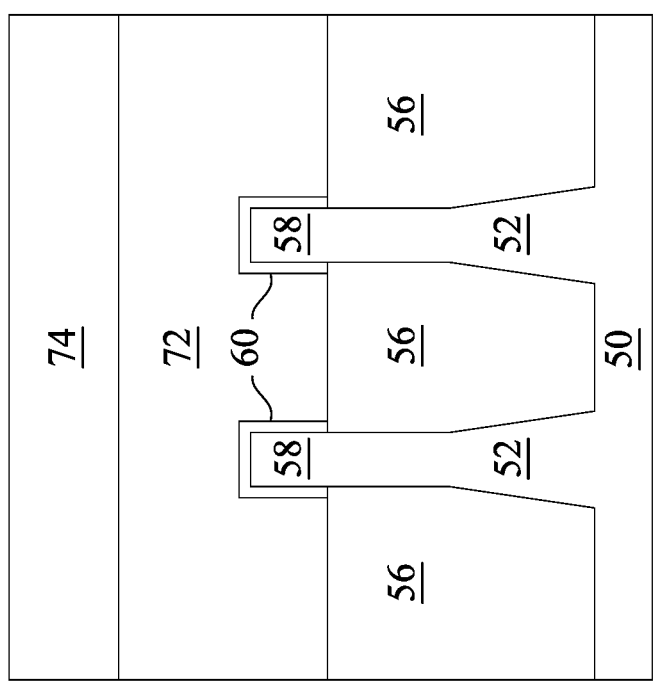
Figure 10C:
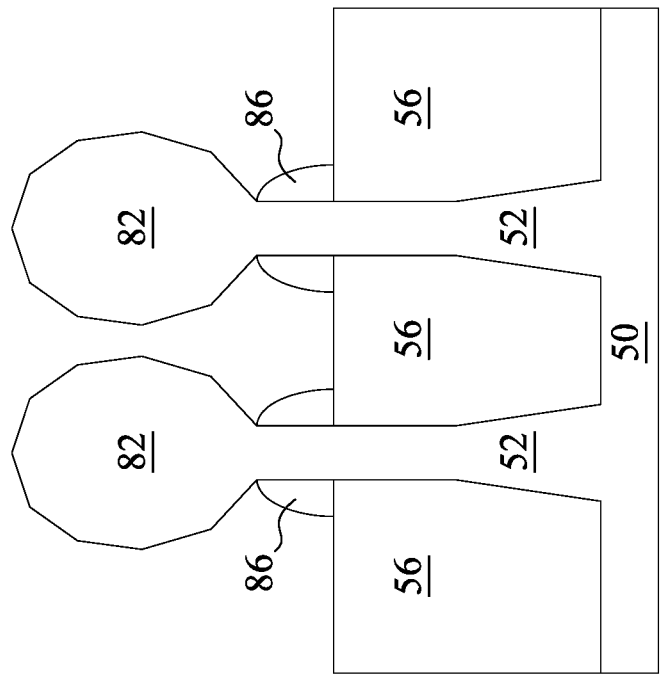
Figure 10D:
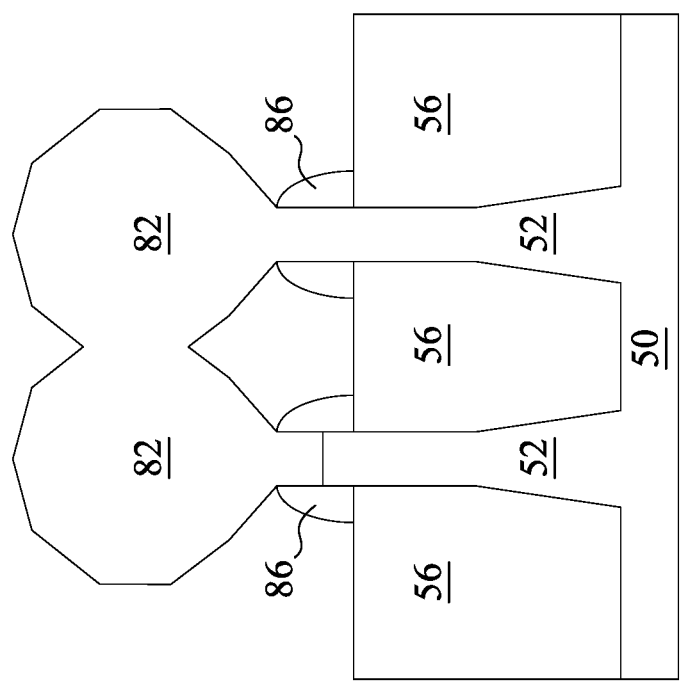
Figure 12B:
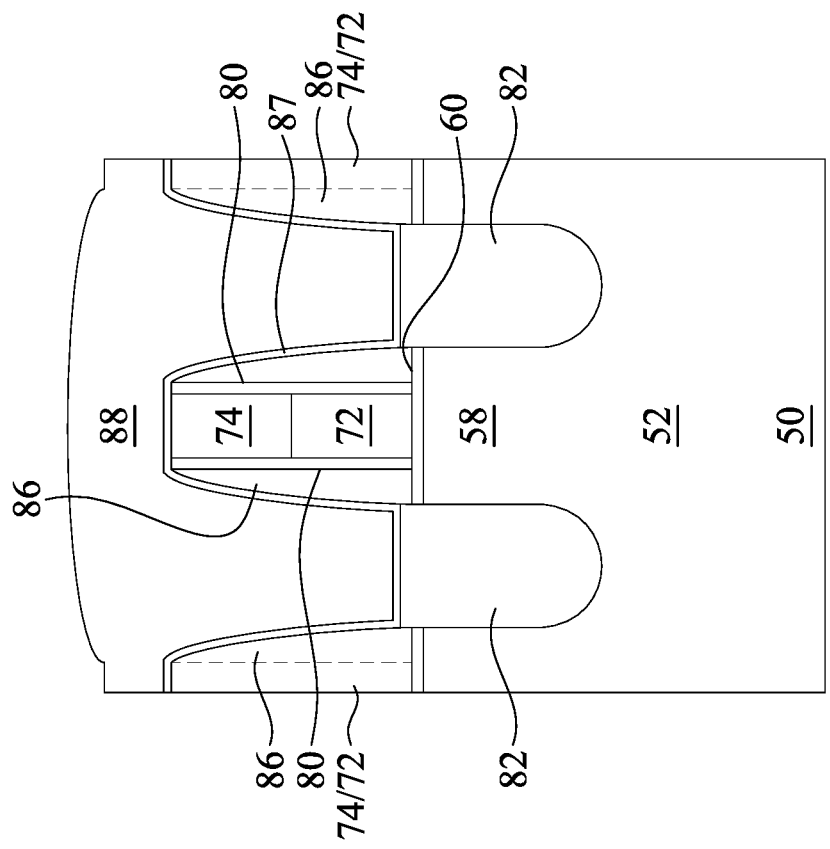
Figure 12A:
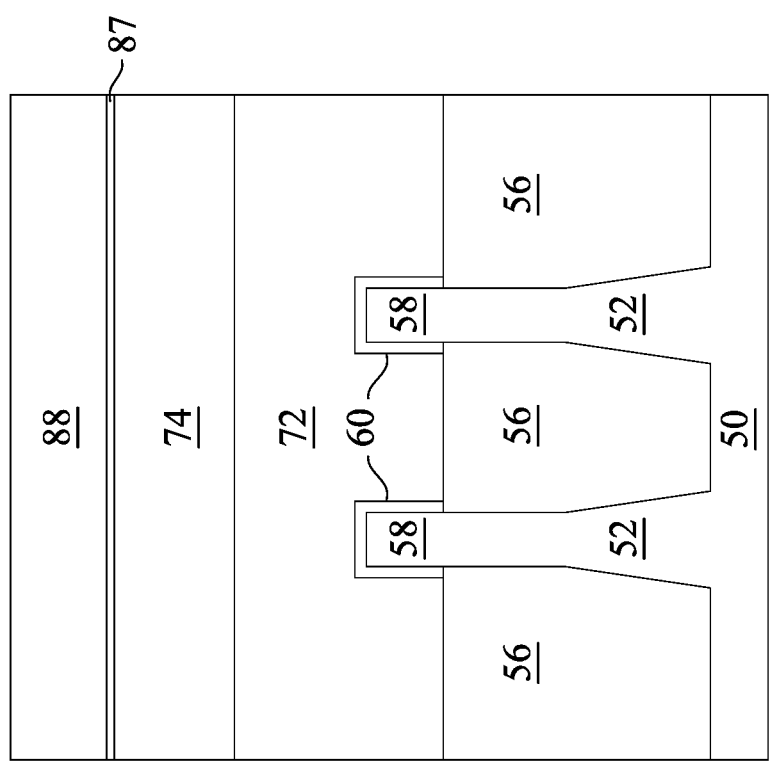

In FIGS. 12A and 12B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 13B:
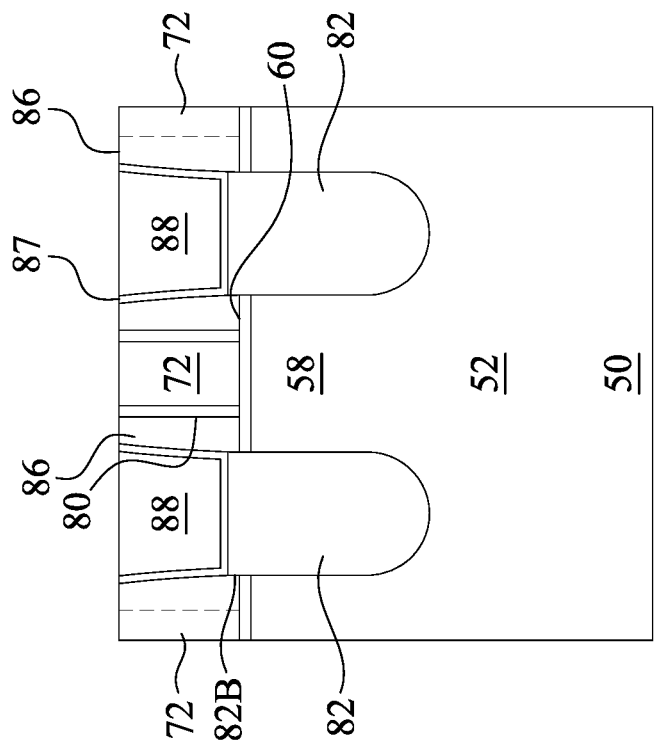
Figure 13A:
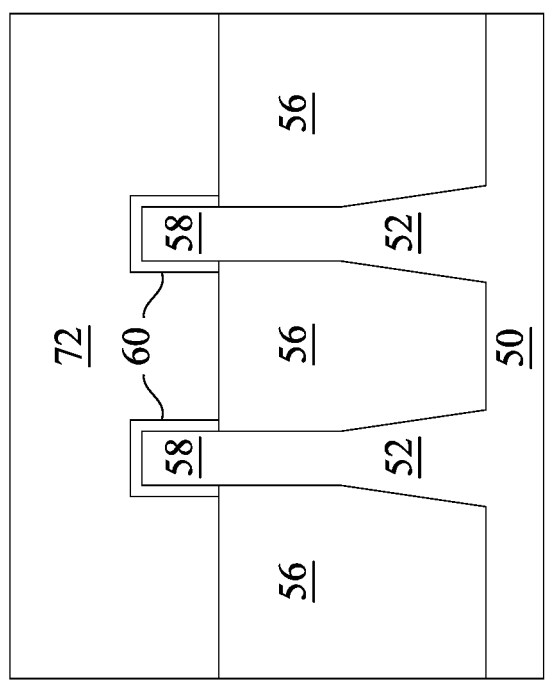

In FIGS. 13A and 13B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 14B:
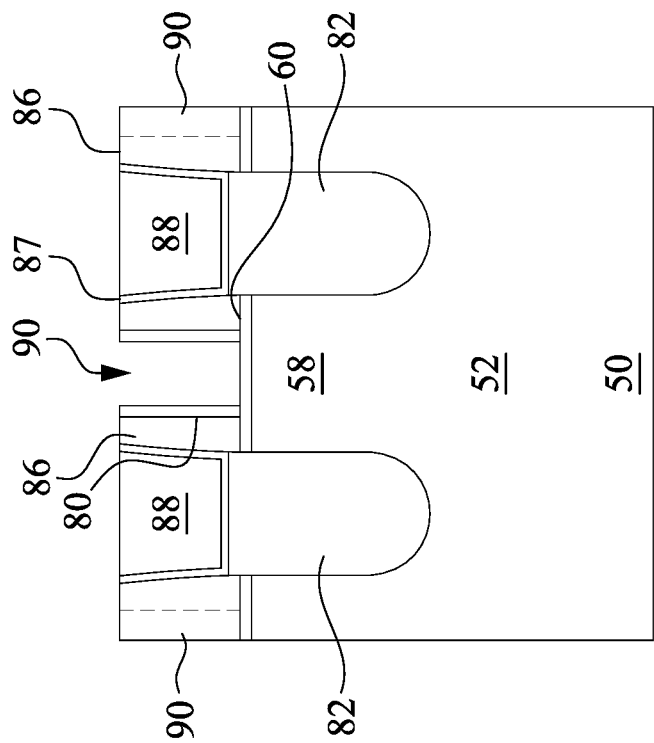
Figure 14A:
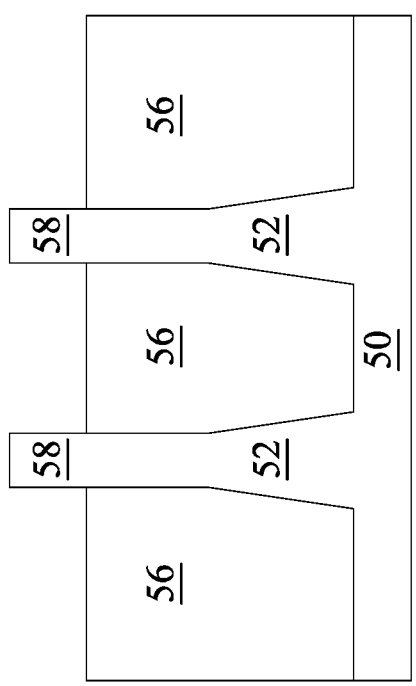

In FIGS. 14A and 14B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 15B:
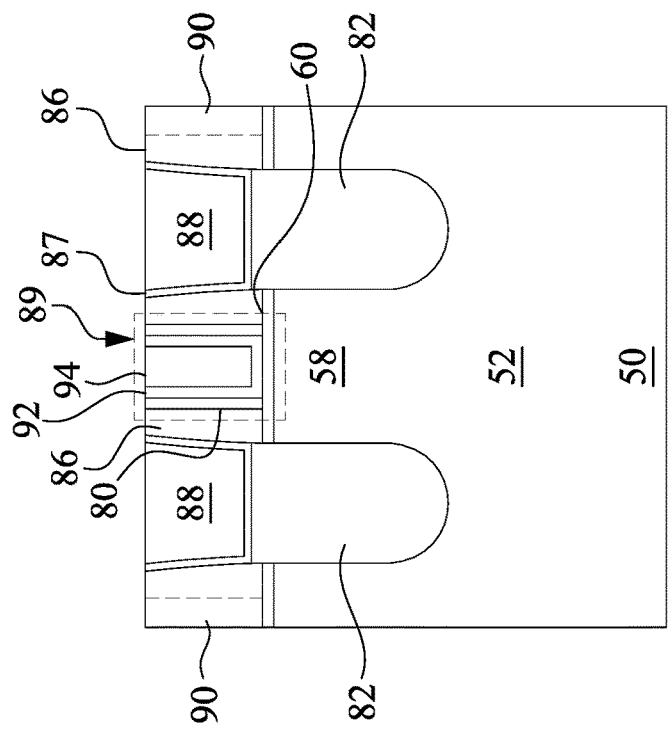
Figure 15A:
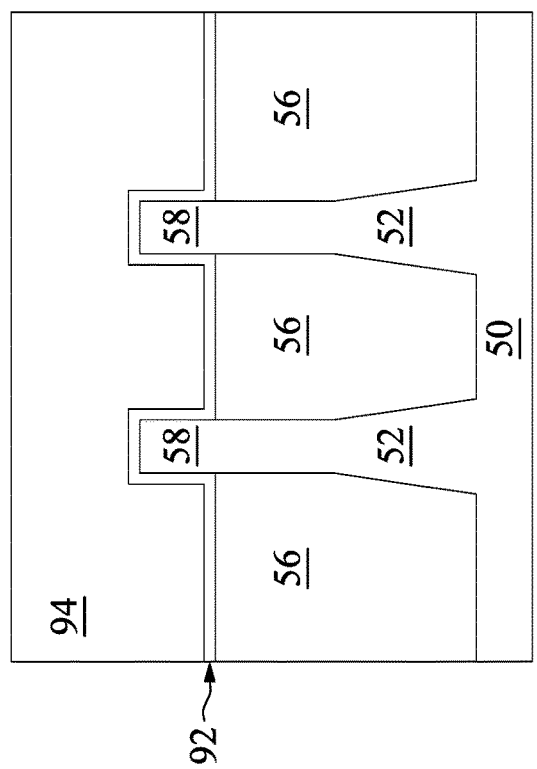
Figure 15C:
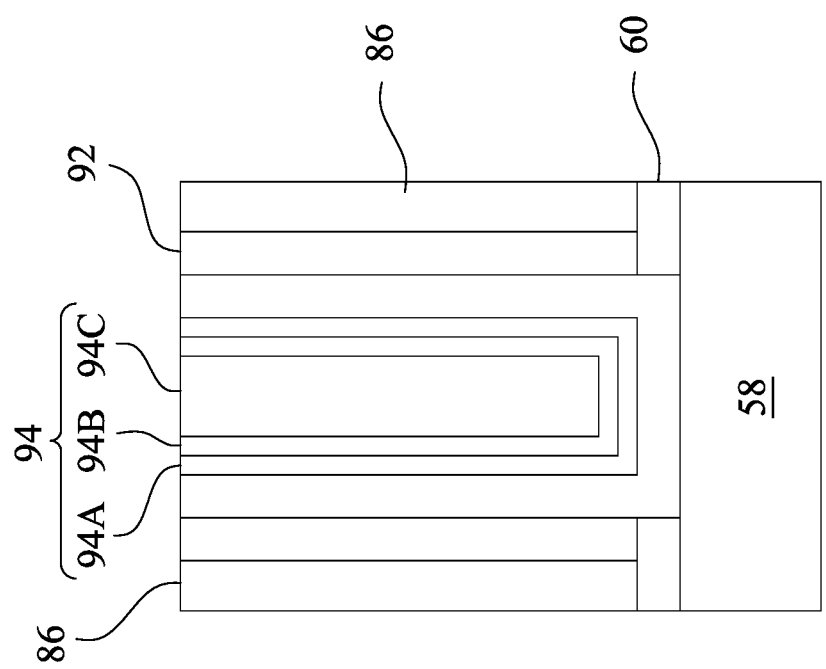

In FIGS. 15A and 15B, gate dielectric layers 92 and gate electrodes 94 are formed for replacement gates. FIG. 15C illustrates a detailed view of region 89 of FIG. 15B. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 15B, the gate electrode 94 may comprise any number of liner layers 94A, any number of work function tuning layers 94B, and a fill material 94C as illustrated by FIG. 15C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 16B:
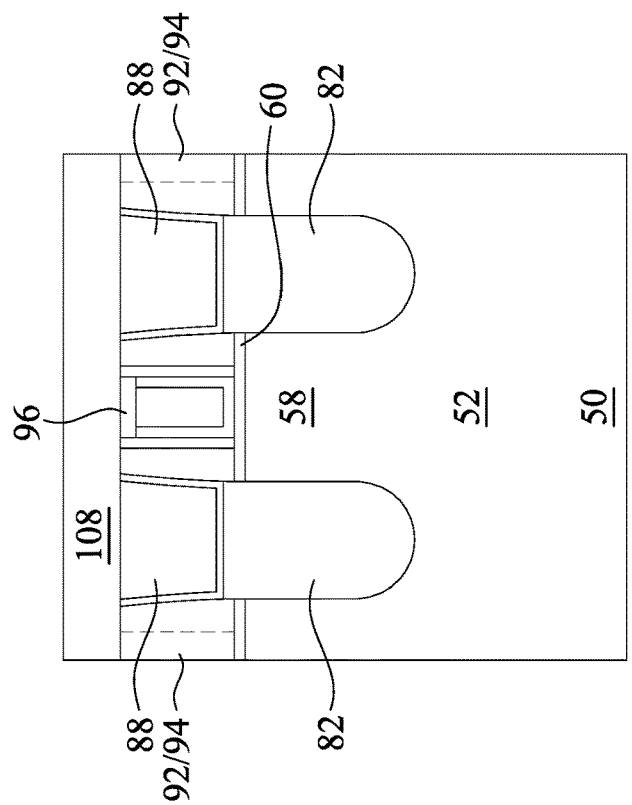
Figure 16A:
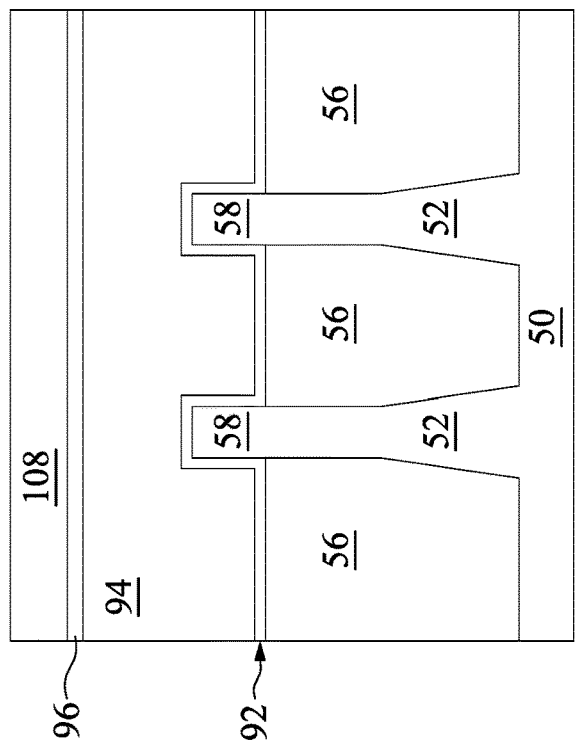

In FIGS. 16A and 16B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 16A and 16B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 17A and 17B) penetrate through the second ILD 108 and the gate mask 96 to contact the top surface of the recessed gate electrode 94.

Figure 17B:
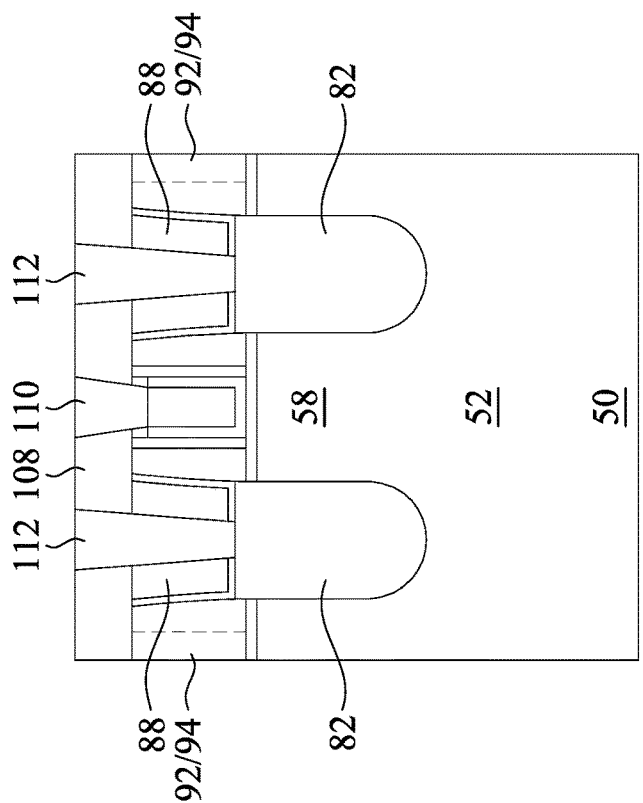
Figure 17A:
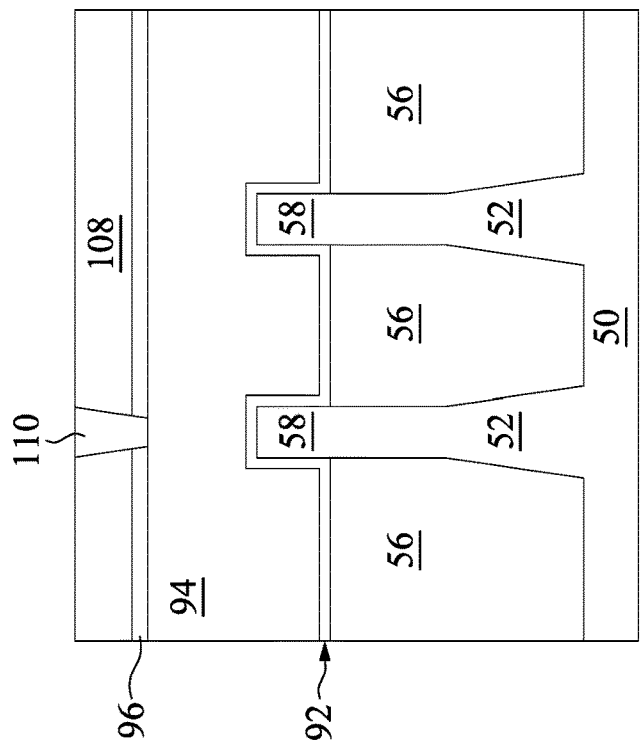
Figure 17C:
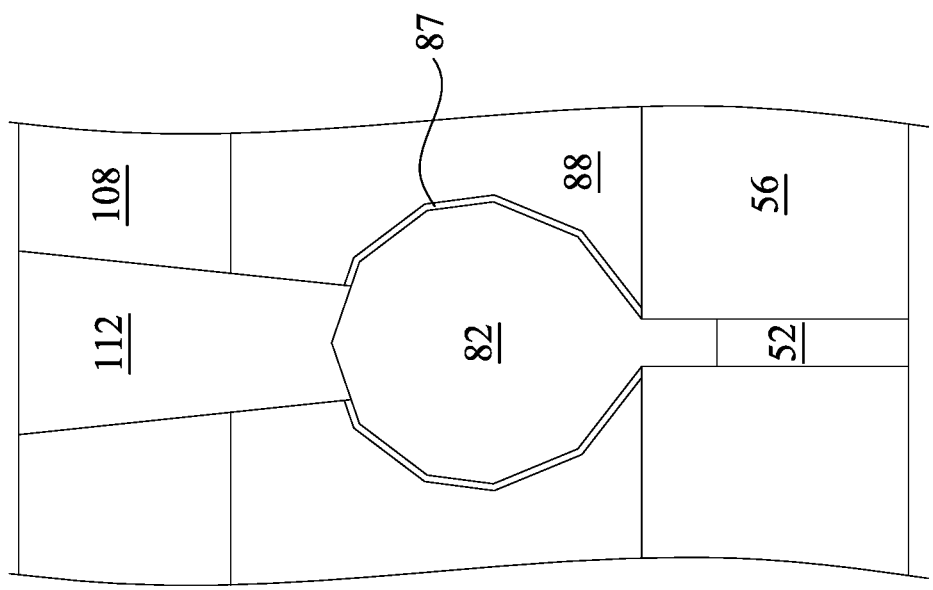

In FIGS. 17A, 17B, and 17C, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. As illustrated in FIG. 17C, in some embodiments, the interface between the epitaxial source/drain regions 82 and the source/drain contacts 112 is as long as the distance D1 in the cross-sectional view illustrated in FIG. 11B. In some embodiments, the interface between the epitaxial source/drain regions 82 and the source/drain contacts 112 is longer than the distance D1 in the cross-sectional view illustrated in FIG. 11B. In some embodiments, the interface between the source/drain region contacts 112 is curved and follows the faceted outer surface of the source/drain region 82 (see FIG. 17C). In some embodiments, the interface between the source/drain region contacts 112 is planar and does not follow the faceted outer surface of the source/drain region 82. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Embodiments may achieve advantages. The disclosed semiconductor device and method of forming the same improve the performance of FinFET devices by reducing the source/drain contact resistance of the semiconductor device. In the disclosed embodiments, the source/drain regions include a multi-faceted epitaxial source/drain region with an enlarged contact landing area to reduce the resistance between the contact and the source/drain region. In some embodiments, the epitaxial source/drain region for a single fin includes eight or more facet planes. By having more facet planes for the epitaxial source/drain region, the top surface of the epitaxial source/drain region—where the contact landing area is located—is flatter and thus allows for a larger contact landing area. The more facet planes in the epitaxial source/drain region may be formed by configuring the ratio of flow rates of etchant precursors to deposition precursors during the epitaxial growth process of the source/drain region. For example, by having an ultra-low ratio of flow rates of etchant precursors to deposition precursors, the number of facets can increase. The disclosed processes and structures can improve the performance and reliability of the FinFET device.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

An embodiment includes a first fin extending from a substrate. The device also includes a first gate stack over and along sidewalls of the first fin. The device also includes a first gate spacer disposed along a sidewall of the first gate stack. The device also includes a first epitaxial source/drain region in the first fin and adjacent the first gate spacer, an outer surface of the epitaxial first source/drain region having more than eight facets in a first plane, the first plane being orthogonal to a top surface of the substrate.

Embodiments may include one or more of the following features. The device where the first epitaxial source/drain region includes a first epitaxial layer on the first fin, the first epitaxial layer having a first doping concentration of boron; and a second epitaxial layer on the first epitaxial layer, the second epitaxial layer having a second doping concentration of boron, the second doping concentration being greater than the first doping concentration. The first epitaxial layer has a higher germanium concentration than the second epitaxial layer. The device further including a second fin extending from a substrate, a second gate stack over and along sidewalls of the second fin, a second gate spacer disposed along a sidewall of the second gate stack, and a second source/drain region in the second fin and adjacent the second gate spacer, the second source/drain region including a third epitaxial layer, the third epitaxial layer having a different material composition than the first and second epitaxial layers. The facets on the outer surface of the epitaxial first source/drain region are along (111), (113), and (119) planes. The device further including an etch stop layer over the first epitaxial source/drain region and on a sidewall of the first gate spacer, a first interlayer dielectric over the etch stop layer, a second interlayer dielectric over the first interlayer dielectric, and a first conductive contact extending through the first and second interlayer dielectrics and the etch stop layer, the first conductive contact being electrically coupled to the first epitaxial source/drain region. The first epitaxial source/drain region contacts the first gate spacer. An intersection of adjacent facets on the outer surface of the epitaxial first epitaxial source/drain region form a first angle, the first angle being in a range from 140° to 180°.

An embodiment includes depositing a first dummy gate over and along sidewalls of a first fin, the first fin extending from a substrate. The method also includes forming a first gate spacer along a sidewall of the first dummy gate. The method also includes forming a first recess in the first fin adjacent the first gate spacer. The method also includes epitaxially growing a first source/drain region in the first recess, an outer surface of the first source/drain region having more than eight facets in a first plane, the first plane being orthogonal to a top surface of the substrate.

Embodiments may include one or more of the following features. The method where epitaxially growing the first source/drain region in the first recess includes epitaxially growing the first source/drain region in the first recess with a first ratio of etchant precursors to deposition precursors, the first ratio being in a range from 0.05/1 to 0.25/1. An intersection of adjacent facets on the outer surface of the first source/drain region form a first angle, the first angle being in a range from 140° to 180°. Epitaxially growing the first source/drain region in the first recess includes epitaxially growing a first layer in the first recess, the first layer extending above a top surface of the first fin, the first layer having a first dopant concentration of a first dopant, and epitaxially growing a second layer on the first layer, the second layer having a second dopant concentration of the first dopant, the second dopant concentration being greater than the first dopant concentration. The first dopant is boron. The method further including replacing the first dummy gate with a functional gate stack disposed over and along sidewalls of the first fin. The method further including forming an etch stop layer over the first source/drain region and on a sidewall of the first gate spacer, forming a first interlayer dielectric over the etch stop layer, forming a second interlayer dielectric over the first interlayer dielectric, etching a hole through the first and second interlayer dielectrics and the etch stop layer, and forming a first conductive contact in the hole, the first conductive contact being electrically coupled to the first source/drain region. The first conductive contact physically contacts a top surface of the first source/drain region for a first distance in a first plane, the first plane being orthogonal to a top surface of the substrate and perpendicular to a longitudinal axis of the first fin, a widest portion of the first source/drain region in the first plane being separated by a second distance, the first distance being in a range of 30% to 70% of the second distance. The facets on the outer surface of the first source/drain region are along (111), (113), and (119) planes.

An embodiment includes forming a first dummy gate over and along sidewalls of a first fin extending upwards from a substrate. The method also includes forming a first gate spacer along a sidewall of the first dummy gate. The method also includes etching a first recess in the first fin adjacent the first gate spacer. The method also includes epitaxially growing a first source/drain region in the first recess with a first ratio of etchant precursors to deposition precursors, the first ratio being in a range from 0.05/1 to 0.25/1. The method also includes and replacing the first dummy gate with a first functional gate stack disposed over and along sidewalls of the first fin.

Embodiments may include one or more of the following features. The method where epitaxially growing the first source/drain region in the first recess further includes epitaxially growing a first epitaxial layer from the first fin in the first recess, and epitaxially growing a second epitaxial layer from the first epitaxial layer, the second epitaxial layer having a greater concentration of boron than the first epitaxial layer. An outer surface of the first source/drain region has more than eight facets in a first plane, the first plane being orthogonal to a top surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a first dummy gate over and along sidewalls of a first fin, the first fin extending from a substrate;
   forming a first gate spacer along a sidewall of the first dummy gate;
   forming a first recess in the first fin adjacent the first gate spacer; and epitaxially growing a first source/drain region in the first recess, the first source/drain region having a first layer and a second layer, the first layer having a higher germanium concentration than the second layer, the first layer having a lower boron concentration than the second layer, the first layer being the innermost layer of the first source/drain region, an outer surface of the second layer of the first source/drain region having more than eight facets in a first plane, the first plane being orthogonal to a top surface of the substrate, the first layer having a boron concentration in a range from 3E20 cm$^{-3}$ to 5E20 cm$^{-3}$, the second layer having a boron concentration in a range from 6E20 cm$^{-3}$ to 1E21 cm$^{-3}$.

2. The method of claim 1, wherein epitaxially growing the first source/drain region in the first recess comprises epitaxially growing the first source/drain region in the first recess with a first ratio of etchant precursors to deposition precursors, the first ratio being in a range from 0.05/1 to 0.25/1.

3. The method of claim 1, wherein an intersection of adjacent facets on the outer surface of the first source/drain region form a first angle, the first angle being in a range from 140° to 180°.

4. The method of claim 1 further comprising:
replacing the first dummy gate with a functional gate stack disposed over and along sidewalls of the first fin.

5. The method of claim 1 further comprising:
forming an etch stop layer over the first source/drain region and on a sidewall of the first gate spacer;
forming a first interlayer dielectric over the etch stop layer;
forming a second interlayer dielectric over the first interlayer dielectric;
etching a hole through the first and second interlayer dielectrics and the etch stop layer; and
forming a first conductive contact in the hole, the first conductive contact being electrically coupled to the first source/drain region.

6. The method of claim 5, wherein the first conductive contact physically contacts a top surface of the first source/drain region for a first distance in a first plane, the first plane being orthogonal to a top surface of the substrate and perpendicular to a longitudinal axis of the first fin, a widest portion of the first source/drain region in the first plane being separated by a second distance, the first distance being in a range of 30% to 70% of the second distance.

7. The method of claim 1, wherein the facets on the outer surface of the first source/drain region are along (111), (113), and (119) planes.

8. The method of claim 1, wherein the second layer is the outermost layer of the first source/drain region.

9. The method of claim 1, wherein the first layer has the highest germanium percentage of any layer in the first source/drain region.

10. A method comprising:
forming a first dummy gate over and along sidewalls of a first fin extending upwards from a substrate;
forming gate spacers along sidewalls of the first dummy gate and the first fin;
etching a first recess in the first fin adjacent the first dummy gate, the gate spacers being on opposing sides of the first recess;
epitaxially growing a first source/drain region in the first recess with a first ratio of etchant precursors to deposition precursors, the first ratio being in a range from 0.05/1 to 0.25/1, the first source/drain region contacting the gate spacers on opposing sides of the first recess, the first source/drain region having a top surface extending above a top surface of the gate spacers on opposing sides of the first recess, wherein epitaxially growing the first source/drain region in the first recess further comprises:
epitaxially growing a first epitaxial layer from the first fin in the first recess; and
epitaxially growing a second epitaxial layer from the first epitaxial layer, the second epitaxial layer having a greater concentration of boron than the first epitaxial layer, the first epitaxial layer having a greater concentration of germanium than the second epitaxial layer, the second epitaxial layer being the outermost layer of the first source/drain region; and
replacing the first dummy gate with a first functional gate stack disposed over and along sidewalls of the first fin.

11. The method of claim 10, wherein an outer surface of the first source/drain region has more than eight facets in a first plane, the first plane being orthogonal to a top surface of the substrate.

12. The method of claim 10, wherein the first epitaxial layer is the innermost layer of the first source/drain region.

13. A method comprising:
forming a first fin extending from a substrate;
forming a first gate stack over and along sidewalls of the first fin;
forming a first gate spacer disposed along a sidewall of the first gate stack; and
forming a first epitaxial source/drain region in the first fin and adjacent the first gate spacer, an outer surface of the epitaxial first source/drain region having more than eight facets in a first plane, the first plane being orthogonal to a top surface of the substrate, wherein the first epitaxial source/drain region comprises:
a first epitaxial layer on the first fin, the first epitaxial layer having a first doping concentration of boron; and
a second epitaxial layer on the first epitaxial layer, the second epitaxial layer having a second doping concentration of boron, the second doping concentration being greater than the first doping concentration, the first epitaxial layer having a higher germanium concentration than the second epitaxial layer, the first epitaxial layer being the innermost layer of the first epitaxial source/drain region, the first epitaxial layer having a boron concentration in a range from 3E20 cm$^{-3}$ to 5E20 cm$^{-3}$, the second epitaxial layer having a boron concentration in a range from 6E20 cm$^{-3}$ to 1E21 cm$^{-3}$.

14. The method of claim 13 further comprising:
forming a second fin extending from a substrate;
forming a second gate stack over and along sidewalls of the second fin;
forming a second gate spacer disposed along a sidewall of the second gate stack; and
forming a second source/drain region in the second fin and adjacent the second gate spacer, the second source/drain region comprising a third epitaxial layer, the third epitaxial layer having a different material composition than the first and second epitaxial layers.

15. The method of claim 13, wherein the facets on the outer surface of the epitaxial first source/drain region are along (111), (113), and (119) planes.

16. The method of claim 13 further comprising:
forming an etch stop layer over the first epitaxial source/drain region and on a sidewall of the first gate spacer;

forming a first interlayer dielectric over the etch stop layer;

forming a second interlayer dielectric over the first interlayer dielectric; and forming a first conductive contact extending through the first and second interlayer dielectrics and the etch stop layer, the first conductive contact being electrically coupled to the first epitaxial source/drain region.

17. The method of claim 13, wherein the first epitaxial source/drain region contacts the first gate spacer.

18. The method of claim 13, wherein an intersection of adjacent facets on the outer surface of the first epitaxial source/drain region form a first angle, the first angle being in a range from 140° to 180°.

19. The method of claim 13, wherein the second epitaxial layer is the outermost layer of the first epitaxial source/drain region.

20. The method of claim 13, wherein the first epitaxial layer has the highest germanium percentage of any layer in the first epitaxial source/drain region.

* * * * *